United States Patent [19]

Harigane et al.

[11] Patent Number: 5,035,047
[45] Date of Patent: Jul. 30, 1991

[54] ELECTRONIC COMPONENT MOUNTING APPARATUS

[75] Inventors: Kotaro Harigane; Kenichi Takahashi; Hiroaki Honda, all of Tokyo, Japan

[73] Assignee: TDK Corporation, Tokyo, Japan

[21] Appl. No.: 367,254

[22] Filed: Jun. 16, 1989

[30] Foreign Application Priority Data

Jun. 16, 1988 [JP] Japan .............................. 63-146774
Jun. 20, 1988 [JP] Japan .............................. 63-151424
Jul. 19, 1988 [JP] Japan ............................. 63-95544[U]

[51] Int. Cl.$^5$ ............................................. B23P 19/00
[52] U.S. Cl. ...................................... 29/740; 29/836
[58] Field of Search ................. 29/740, 741, 832, 834, 29/836

[56] References Cited

U.S. PATENT DOCUMENTS 4,644,642 2/1987 Wardenaar et al. ................. 29/740
4,675,993 6/1987 Harada .................................... 29/740

Primary Examiner—P. W. Echols
Attorney, Agent, or Firm—Oblon, Spivak, McClelland, Maier & Neustadt

[57] ABSTRACT

An electronic component or chip mounting apparatus capable of carrying out a chip mounting operation at a high speed and with high accuracy. The apparatus includes two transition stations, a chip extracting head reciprocating between a chip feed section and the transition stations and two chip depositing heads arranged for reciprocating between the transition stations and a substrate on which a chip is to be mounted, so that a chip mounting operation may be carried out according to a reciprocating relay system and an operation of depositing the chip on the substrate may take place with high efficiency.

8 Claims, 18 Drawing Sheets

ELECTRONIC COMPONENT MOUNTING APPARATUS

BACKGROUND OF THE INVENTION

1. Field of the Invention

This invention relates to an electronic component mounting apparatus, and more particularly to an apparatus for efficiently mounting various kinds of electronic components such as chip-type components on a substrate at a high speed and with high accuracy.

2. Description of the Prior Art

A typical electronic component (hereinafter also referred to as "chip") mounting apparatus of such type which has been conventionally proposed and used for mounting chips on a substrate is generally constructed in such a manner as disclosed in, for example, Japanese Patent Application Laying-Open Publication No. 265223/1986. More particularly, the conventional chip mounting apparatus is so constructed that electronic components or chips are picked up one by one in succession from a chip feed section using suitable means, transferred to an intermediate station through suitable means and then taken out or extracted one by one in order by means of a chip mounting head. The extracted chip is then deposited or placed at a predetermined position on a work by the head.

In the conventional chip mounting apparatus, the intermediate station and mounting head each are adapted to handle only one chip in each chip mounting operation, so that when an increase in the number of chips to be handled causes reciprocating movement of the chip mounting head to be increased correspondingly, resulting in working efficiency in the chip mounting operation being deteriorated. Thus, it will be noted that the conventional chip mounting apparatus fails to simultaneously treat a plurality of chips in each chip mounting operation.

Another conventional device of such type is disclosed in U.S. Pat. No. 4,644,642 issued to Hendrik on Feb. 24, 1987. In the device disclosed, a number of components are simultaneously picked up in presentation positions by a pick-up device having a number of pick-up elements. Then, the pick-up device is moved to a position over a substrate and each of the pick-up elements in succession is moved to a position over the desired position on the substrate by movement of the pick-up device and/or the substrate with respect to one another. Thereafter, the relevant component is deposited and released in the relevant position by the pick-up element.

Thus, in the device of the U.S. Patent, the single pick-up device is reciprocated directly between the presentation positions and the substrate, so that much time is required for transferring the chips from the presentation positions to the substrate. Also, in the device, any consideration is not given to a time reduction in deposition of the components on the substrate which amounts to a large part of all time required in a component mounting operation. Therefore, the conventional device fails to efficiently practice the mounting operation at a high speed. Further, the device disclosed is not adapted to carry out positional correction of the picked-up component before deposition of the component on the substrate, accordingly, it cannot carry out accurate positioning of the chip with respect to the substrate.

A further conventional electronic component or chip mounting apparatus is proposed which includes a mechanism for positioning a chip, as suggested in Japanese Patent Application Laying-Open Publication Nos. 264788/1986, 214692/1987 and 229900/1987 by the assignee. The chip positioning mechanism disclosed in each of the Japanese publications is adapted to carry out positioning of a chip while nipping the chip through four side surfaces of the chip. Therefore, the mechanism fails to cause a single positioning member to concurrently position a plurality of chips.

In view of the foregoing, the assignee proposed a chip positioning mechanism constructed so as to position a chip based on its two surfaces, which is disclosed in Japanese Patent Application Laying-Open Publication No. 32692/1987. In the proposed mechanism, a support on which chips are supported is moved obliquely with respect to a positioning member so as to have components of movement in both X and Y directions. Unfortunately, the mechanism is for the purpose of accurately positioning only one chip in each chip mounting operation, accordingly, it cannot concurrently position a plurality of chips in each chip mounting operation.

A chip mounting head of the index rotation type has been used as a chip mounting head for the conventional chip mounting apparatus, which is disclosed in Japanese Patent Application Laying-Open Publication No. 30399/1987. The head includes a plurality of suction pins arranged at equal angular intervals on an index head and is adapted to cause each of the suction pins to be rotated by a predetermined angle when the index head is moved to a particular position.

Another chip mounting head is also proposed which has a plurality of suction pins arranged thereon in a row and is mounted on a lower side of an X-Y table. In the chip mounting head, the suction pins on which chips are respectively held are simultaneously moved to a position above a printed board or substrate to deposit the chips on the printed board in sequence. In this instance, when rotation angles of the suction pins are set in sequence independent from one another as in the mounting head of the index rotation type described above, a lot of time is required to set a posture of a chip held on each of the suction pins at a predetermined angle.

The words "electronic component mounting operation" or "chip mounting operation" used herein generally indicates an operation ranging from extraction of chips from a chip feed section to deposition of the chips on a substrate.

SUMMARY OF THE INVENTION

The present invention has been made in view of the foregoing disadvantages of the prior art.

Accordingly, it is an object of the present invention to provide an electronic component mounting apparatus which is capable of efficiently accomplishing an electronic component mounting operation at a high speed.

It is another object of the present invention to provide an electronic component mounting apparatus which is capable of causing extraction of electronic components from a feed section and deposition of the components on a substrate to be well-balanced from a viewpoint of time in an electronic component mounting operation, resulting in time required for a mounting operation to be significantly reduced.

It is another object of the present invention to provide an electronic component mounting apparatus which is capable of simultaneously handling various types of electronic components.

It is still another object of the present invention to provide an electronic component mounting apparatus which is capable of carrying out an electronic component mounting operation with high accuracy.

It is yet another object of the present invention to provide an electronic component mounting apparatus which is capable of increasing the number and types of electronic components to be handled per unit floor area.

It is even another object of the present invention to provide an electronic component mounting apparatus which is capable of rapidly and effectively carrying out positional correction of electronic components to be mounted in a simple manner.

It is still a further object of the present invention to provide an electronic component mounting apparatus which is capable of efficiently attaining positional correction of electronic components in a significantly reduced space.

It is yet a further object of the present invention to provide an electronic component mounting apparatus which is capable of rapidly carrying out deposition of electronic components on a substrate with high accuracy.

It is an even further object of the present invention to provide an electronic component mounting apparatus which is capable of being simplified in structure and significantly small-sized.

In accordance with the present invention, an electronic component mounting apparatus is provided. The apparatus includes a stationary feed section for feeding electronic components including a plurality of electronic component feed units, a plurality of transition stations and a single electronic component extracting head section. The extracting head section includes a plurality of suction pins for extracting electronic components by suction from the stationary feed section and placing them on the transition stations. Also, the apparatus includes a plurality of electronic component depositing head sections which are arranged corresponding in number to the transition stations. Each of the depositing head sections includes a plurality of suction pins and picks up electronic components by suction from the transition station to deposit them on each of substrates positioned corresponding in number to the transition stations.

BRIEF DESCRIPTION OF THE DRAWINGS

These and other objects and many of the attendant advantages of the present invention will be readily appreciated as the same becomes better understood by reference to the following detailed description when considered in connection with the accompanying drawings in which like reference numerals designate like or corresponding parts throughout; wherein.

DETAILED DESCRIPTION OF THE PREFERRED EMBODIMENT

Now, an electronic component or chip mounting apparatus according to the present invention will be described hereinafter with reference to the accompanying drawings.

Figure 1:
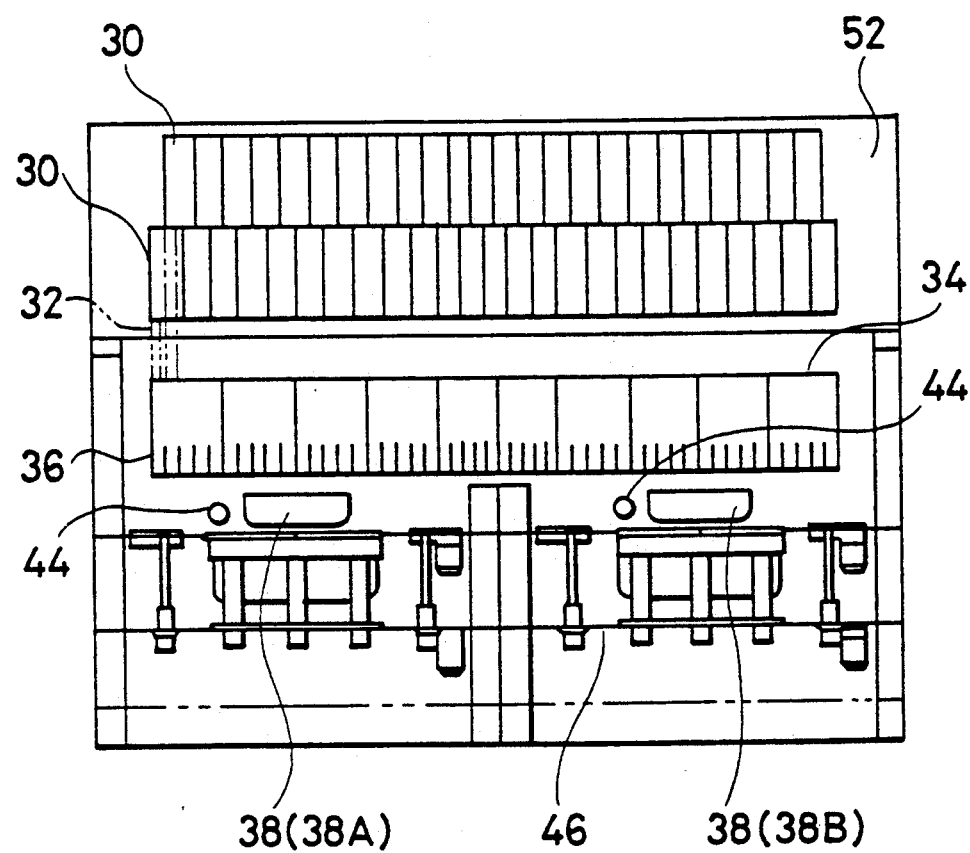
FIG. 1 is a plan view showing an embodiment of an electronic component mounting apparatus according to the present invention wherein an electronic component extracting head section, electronic component depositing head sections and printed boards or substrates are omitted for clarification.
Figure 2:
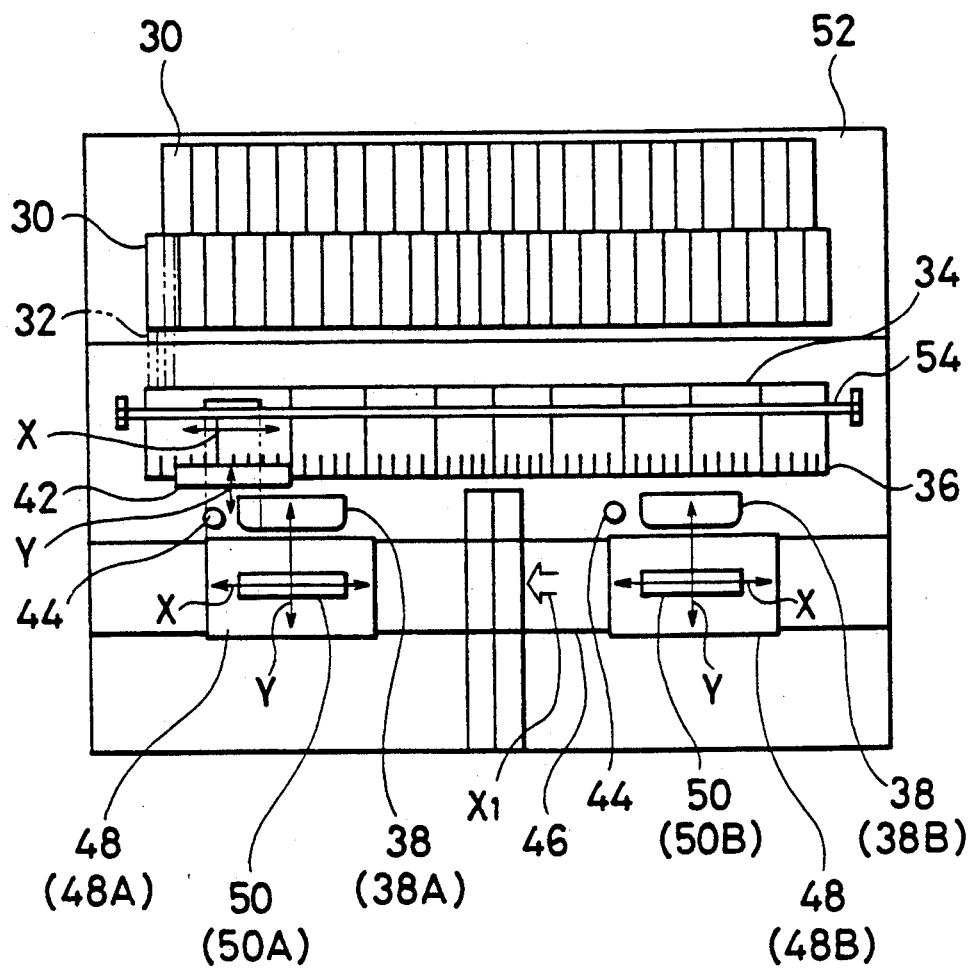
FIG. 2 is a schematic plan view similar to FIG. 1 wherein an extracting head section, depositing head sections and substrates are shown.
Figure 3:
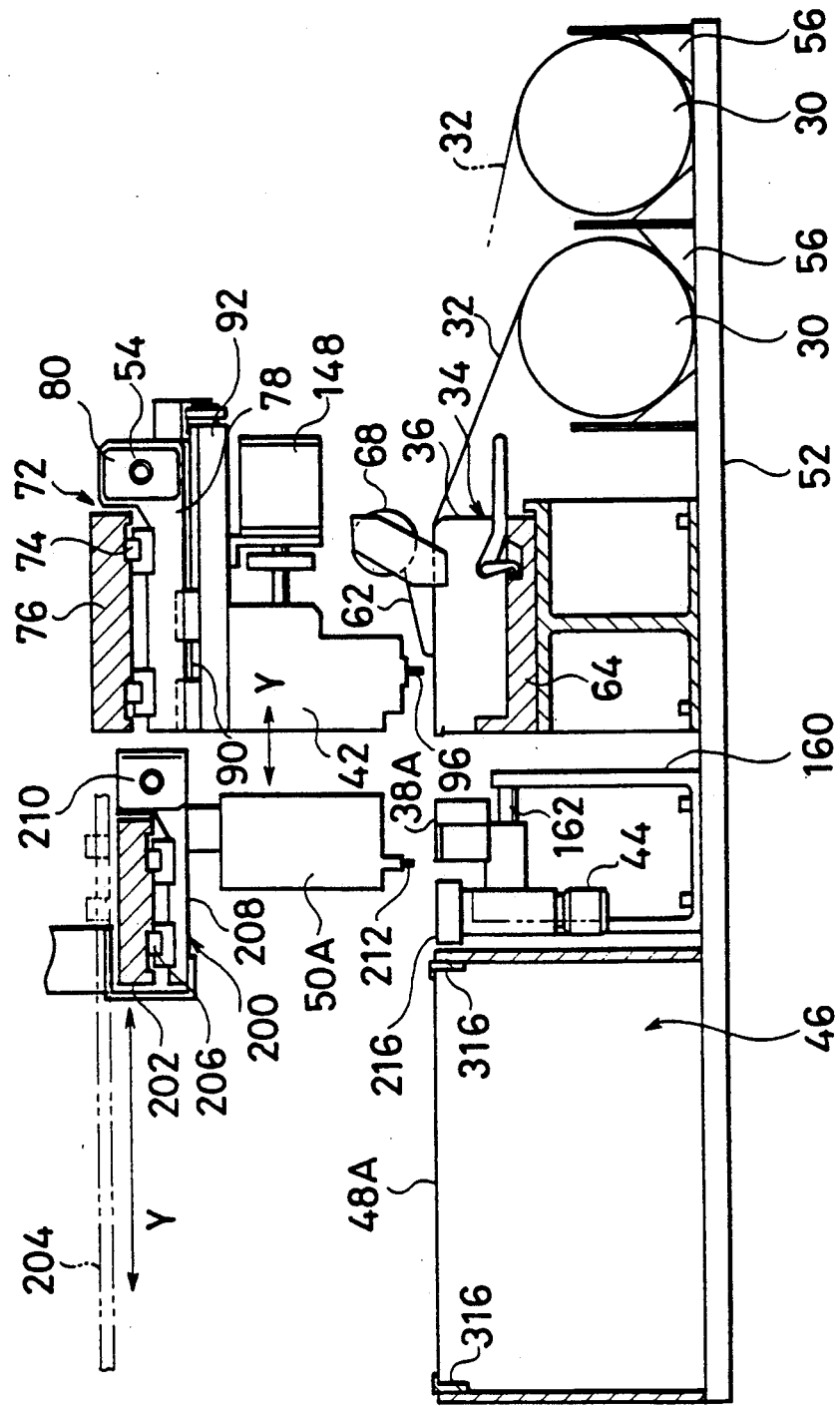
FIG. 3 is a side elevation view in section of the apparatus shown in FIG. 1.

A chip mounting apparatus of the illustrated embodiment, as shown in FIGS. 1 to 3, generally includes a plurality of reels 30 each having a tape 32 wound thereon, a stationary chip feed section 34 including a number of feed units 36 juxtaposed or arranged in a row, a couple of transition stations 38 (38A and 38B) for temporarily putting thereon electronic components or chips 40 (FIG. 4) extracted from the stationary feed section 34 and correcting a posture or position of each of the chips 40, an electronic component or chip extracting head section 42 for extracting chips 40 from the stationary feed section 34 and transferring them to the transition stations 38A and 38B, cameras 44 for image processing, a belt conveyer mechanism 46 for transferring printed boards or substrates 48 (48A and 48B) to predetermined positions, and electronic component or chip depositing head sections 50 (50A and 50B) arranged in corresponding number to the transition stations 38A and 38B. The above-described elements or members of the apparatus are arranged on a base 52. In the illustrated embodiment, the substrates 48 are transferred to and placed at predetermined positions located on the apparatus corresponding in number to the transition stations 38A and 38B by the belt conveyer mechanism 46. Also, in the illustrated embodiment, the reels 30 are arranged in two rows each including a number of reels as shown in FIGS. 1 and 2.

In FIG. 1, the chip extracting head section 42, chip depositing head sections 50A and 50B and substrates 48A and 48B are omitted so that the illustrated embodiment may be easily understood based on a comparison between FIGS. 1 and 2.

The chip extracting head section 42, as shown in FIG. 3, is arranged in a manner to be movable in an X direction over all feed units 36 along a ball screw shaft 54 arranged so as to transversely extend above all feed units 36, as well as movable in a Y direction perpendicular to the X direction, resulting in being moved between a feed position of each feed unit 36 at which a chip is exposed so as to permit the head section 42 to extract it therefrom and each of the transition stations 38A and 38B. The chip extracting head section 42, as detailedly described below, includes a number of suction pins arranged so as to be vertically movable independent from one another.

The chip depositing head sections 50A and 50B, as described below, includes a number of suction pins and each are mounted on a lower surface of each of X-Y tables arranged separate from one another so as to be movable in both X and Y directions. The depositing head section 50A is adapted to pick up chips from the transition station 38A by suction and deposit them on predetermined positions on the left-hand substrate 48A (FIG. 2) carried by the belt conveyer mechanism 46. An adhesive having been previously applied on the substrate. Likewise, the chip depositing head section 50B functions to pick up chips from the transition station 38B by suction and deposit them on predetermined positions on the right-hand adhesive-applied substrate 48B carried by the belt conveyer mechanism 46.

In the illustrated embodiment, the conveyer belt mechanism 46 is adapted to transfer substrates 48 in a direction indicated at an arrow $X_1$ in FIG. 2.

The cameras 44 each are so arranged that an image of each of chips held on each of the depositing head sections 50A and 50B may be taken therethrough. For this purpose, the chip depositing head sections 50A and 50B may be moved in a manner to reach the substrates 48A and 48B after passing through positions above the cameras, respectively.

Figure 4:
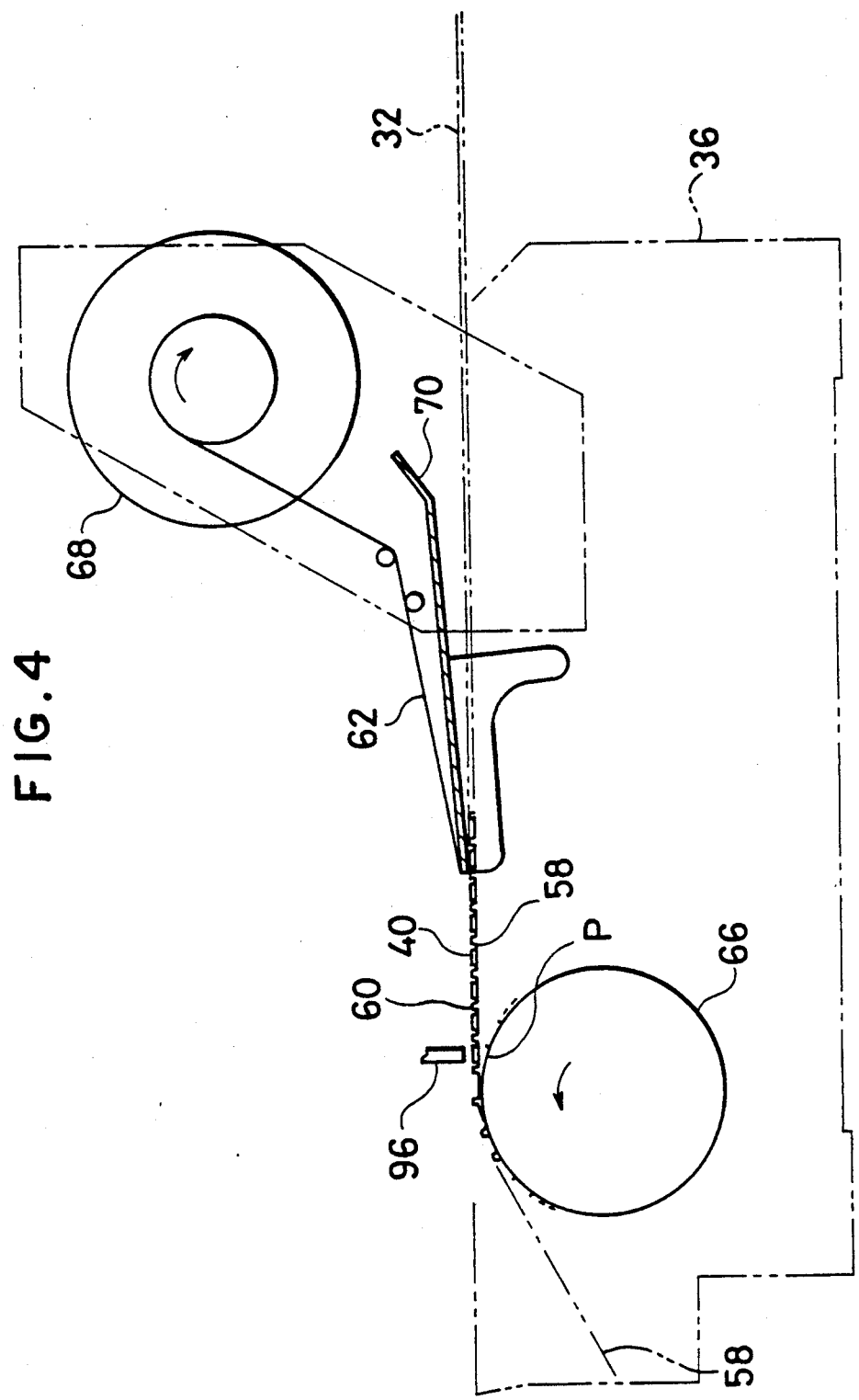
FIG. 4 is a schematic side elevation view showing an electronic component feed unit.

The reels 30, as shown in FIGS. 1 to 3 and briefly described above, are arranged on a rear section of the base 52 in two rows in a manner to alternate with one another in turn. Each row includes a number of reels. The reels 30 are each rotatably supported on reel carriers 56 mounted on the base 52, respectively. Such alternate arrangement of the reels 30 in two rows permits a large number of the thinwall feed units 36 to be placed in juxtaposition with one another. The tape 32 wound on each of the reels 30, as shown in FIG. 4, includes a carrier tape section 58 which is formed with a number of embosses 60 at equal intervals in both lateral and longitudinal directions thereof. The embosses 60 each have a chip 40 received therein. The tape also includes a cover tape section 62 for covering the carrier tape section 58. The tapes 32 drawn out from the reels are then introduced into the corresponding feed units 36, respectively.

The feed units 36, which are clearly shown in FIG. 3, are detachably mounted on a feed unit support 64 fixed on the base 52 and each include a pitch feed wheel 66 for feeding the carrier tape section 58 of the tape 32 at predetermined pitches and a take-up reel 68 for taking up a portion of the cover tape section 62 peeled off from the carrier tape section 58 thereon, and a guide member 70 for guiding the cover tape section 62 peeled. Thus, the tape 32 which is so constructed that the chips 40 are received in the embosses 60 of the carrier tape section 58 and the carrier tape section 58 is covered with the cover tape section 62 is introduced in the corresponding feed unit 36, wherein the cover tape section 62 is peeled off from the carrier tape section 58, resulting in the chips 40 being exposed at a feed position P at which suction pins of the chip extracting head section 42 extract the chips.

Now, the chip extracting head section 42 will be described detailedly with reference to FIGS. 3 and 5.

The extracting head section 42 is mounted on a lower surface of a lengthwise X-Y table 72. More particularly, the X-Y table 72 includes an X-direction slide guide 74 which is fixed on a frame 76 vertically mounted on the base 52 and on which an X-direction slider 78 is slidably supported. Also, a female screw member 80 is provided integral with the X-direction slider 78 and threadedly engaged with the elongated ball screw shaft 54 transversely extending in the X direction above all the feed units 36. The shaft 54 is supported at both ends thereof in bearings 82 and has a pulley 84 mounted on one end thereof. The pulley 84 is operatively connected through a belt 86 to a motor 88 mounted on the frame 76, so that a driving force of the motor 88 is transmitted through the belt 86 to the pulley 84. This results in the X-direction slider 78 being moved over all feed units 36 due to rotation of the ball screw shaft 54.

On a lower surface of the X-direction slider 78 is securely mounted a Y-direction slide guide 90, on which a Y-direction slider 92 is slidably supported. The chip extracting head section 42 is mounted on a lower side of the Y-direction slider 92. Between the X-direction slider 78 and the Y-direction slider 92 is arranged an air cylinder 94 for moving the Y-direction slider in the Y direction by a predetermined or constant distance because in the illustrated embodiment a distance in the Y direction between the chip feed position of each feed unit and each of the transition stations 38A and 38B is kept constant.

Also, the chip extracting head section 42 includes a number of suction pins 96 as briefly described. More particularly, in the illustrated embodiment, the head section 42 includes twenty (20) suction pins 96A for chips of a normal size and four (4) suction pins 96B for chips of a large size, as shown in FIG. 5. The suction pins 96B are arranged at increased intervals as compared with the suction pins 96A.

Figure 6:
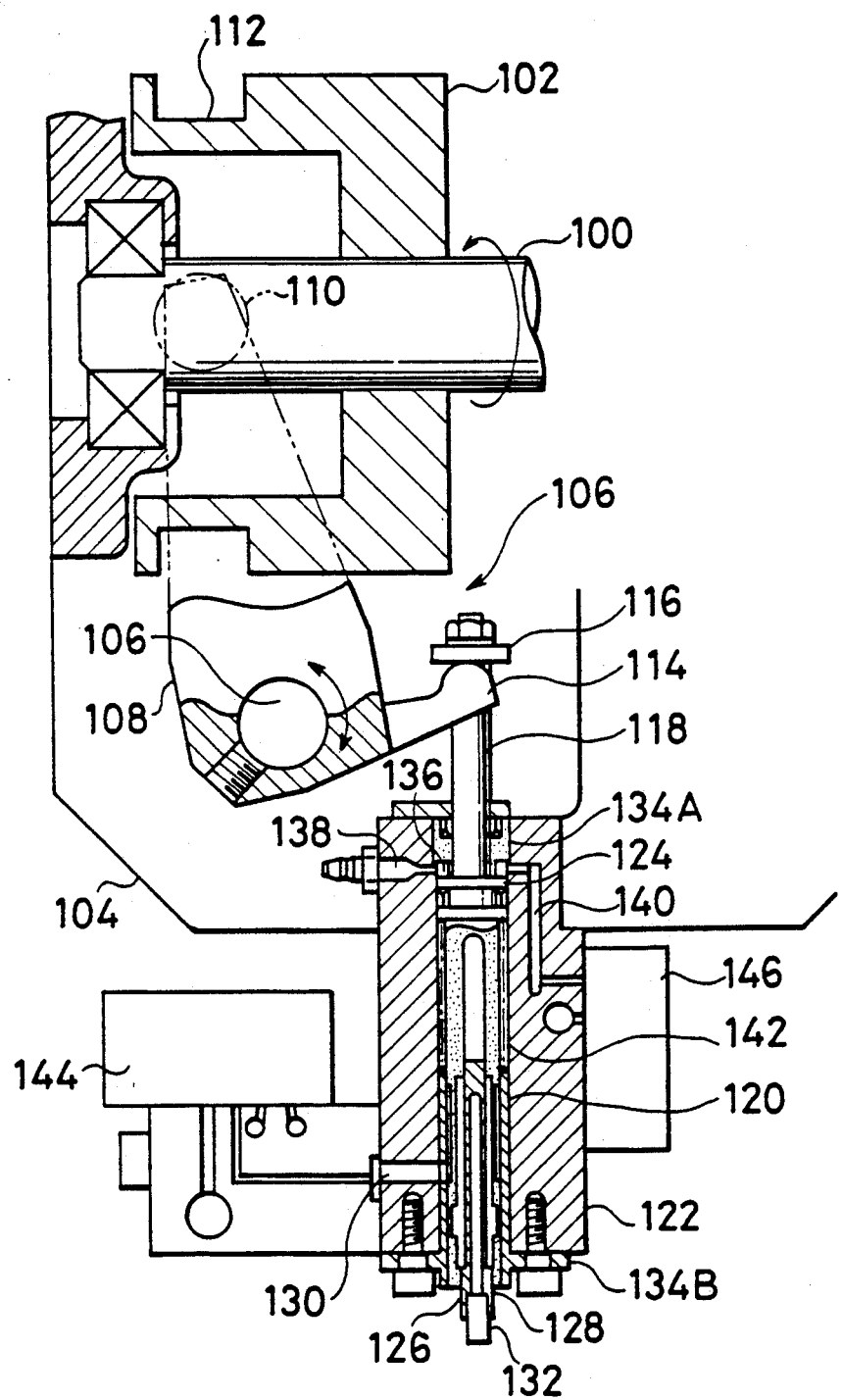
FIG. 6 is a side elevation view in section showing a suction pin actuating mechanism employed in the extracting head section of FIG. 5.

FIG. 6 shows a suction pin actuating mechanism provided corresponding to or with respect to each of the suction pins 96A and 96B for vertically moving the suction pin. For this purpose, a revolving shaft 100 is arranged on which a cylindrical grooved cam 102 is fixedly mounted. Also, a frame 104 for the chip extracting head section 42 is provided in which a shaft 106 is supported in the X direction. On the shaft 106 is fixed one end of a single cam follower 108, which has a roller 110 pivotally mounted on the other end thereof. The roller 110 is engaged with a cam groove 112 of the cylindrical grooved cam 102. This causes the cam follower 108 to carry out pivotal movement depending on rotation of the cylindrical grooved cam 102. The single cam follower 108 is common to all the suction pins 96A and 96B and provided at the one end thereof with connections 114 in a manner separate from one another and corresponding to the respective suction pins. The connections 114 each are arranged so as to engage with an association plate 116 mounted on an upper end of an actuation rod 118. Each of the suction pins 96A and 96B is held on a lower end of the actuation rod 118.

Each of the actuation rods 118 is arranged in a cylindrical hole 120 of a block 122 fixedly mounted on the frame 104 in a manner to be slidable in a vertical direction. More particularly, the actuation rod 118 is so formed that its upper portion constitutes a piston for a selective air cylinder, and the suction pin 96 mounted at the lower end of the actuation rod 118 comprises a pin body 126 formed with a suction hole 128 communicated with a vacuum suction passage 130 provided through the block 122 and a tip member 132 fixed at a lower portion of the pin body 126 and provided with at least the suction hole. The cylindrical hole 120 is hermetically closed at upper and lower portions thereof with sealing members 134A and 134B, respectively. The cylindrical hole 120 has a space 136 defined therein above the piston 124, which is communicated with a compressed air feed passage 138 and an exhaust passage 140 each provided through the block 122. Also, in the cylindrical hole 120 is arranged a compression spring 142 which functions to constantly upwardly force or urge the piston 124. The vacuum suction passage 130 is operated by a valve 144 provided with respect to each of the suction pins 96, resulting in accomplishing on-off control of suction of a chip by the tip member 132. Likewise, a valve 146 is provided corresponding to each of the suction pins 96 so as to operate the exhaust passage 140, resulting in carrying out on-off control for selective operation of the suction pin.

Figure 5:
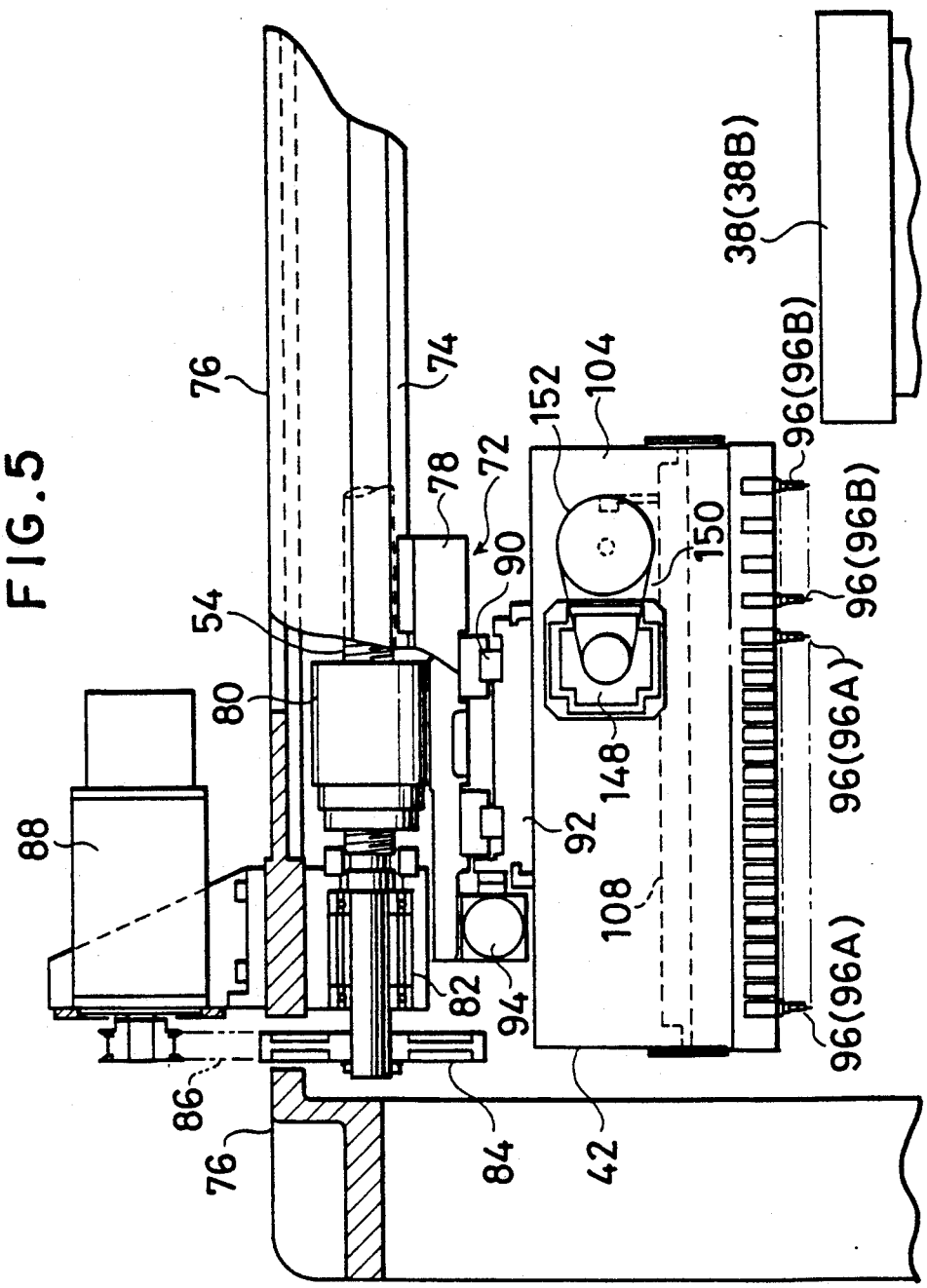
FIG. 5 is a fragmentary rear view showing an extracting head section.

On a rear side of the frame 104, as shown in FIG. 5, is mounted a motor 148, of which a driving force is transmitted through a belt 150 to a pulley 152 fixed on the revolving shaft 100.

In the chip extracting head section 42 constructed as described above, the selective air cylinder does not act on each of the suction pins 96 when the corresponding valves 146 are open, so that the pistons 124 and therefore the actuation rods 118 are kept at their raised position by the compression springs 142. Thus, the suction pins 96 are kept at their raised position irrespective of pivotal movement of the cam follower 108, resulting in the section of the chips by the suction pins 96 being prevented. On the contrary, the selective air cylinder acts on each of the suction pins 96 of which the corresponding valves 146 are closed, so that the pistons 124 of the actuation rods 118 may be downwardly movable against the compression spring 142. This permits the suction pins 96 to be vertically moved following pivotal movement of the cam follower 108, resulting in suction of a chip by the suction pin being carried out. Thus, it will be noted that actuation of the suction pins 96 is carried out through the cam mechanism, to thereby ensure suction of chips at an increased speed.

Figure 7:
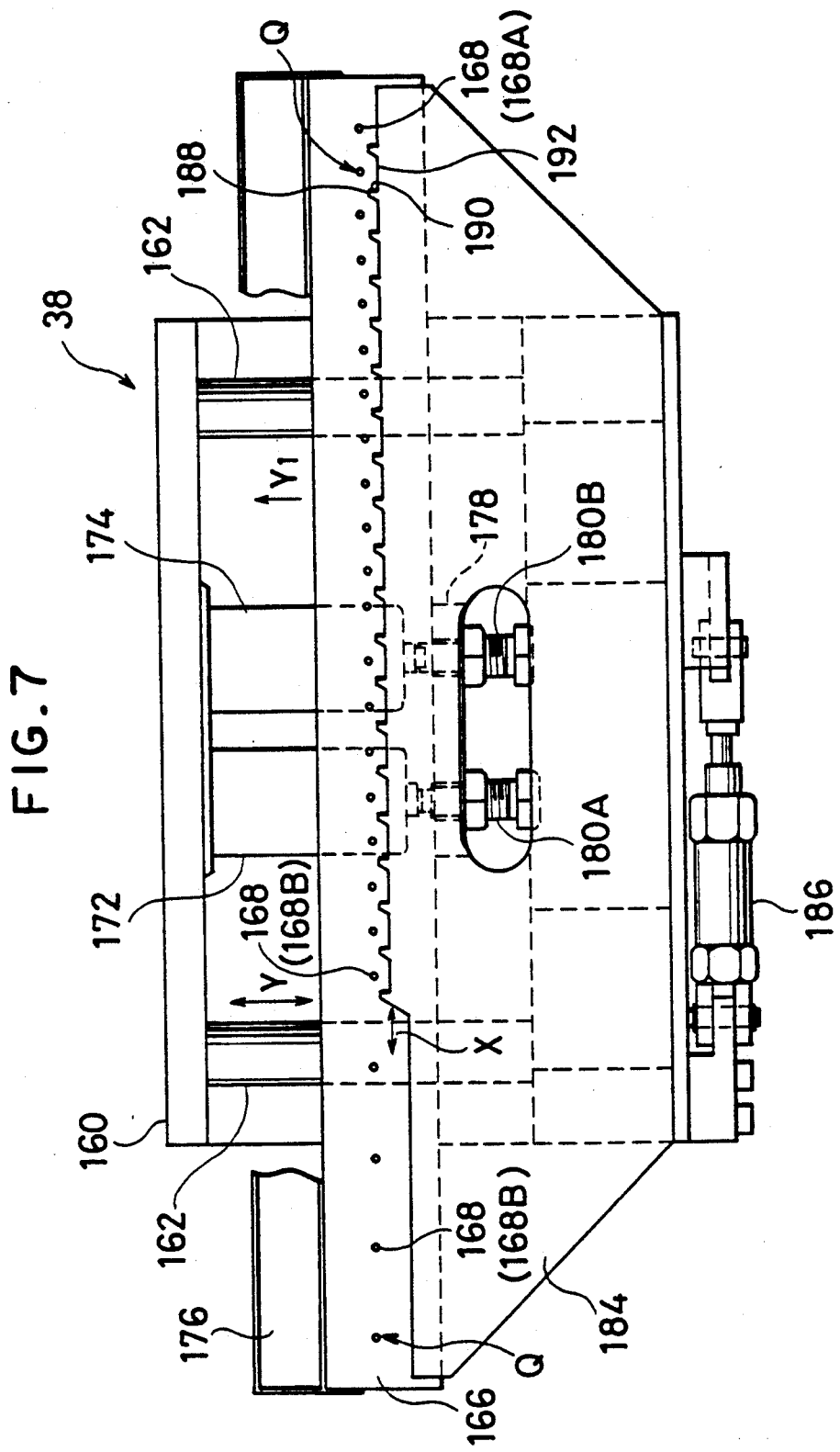
FIG. 7 is a plan view showing a transition station.
Figure 8:
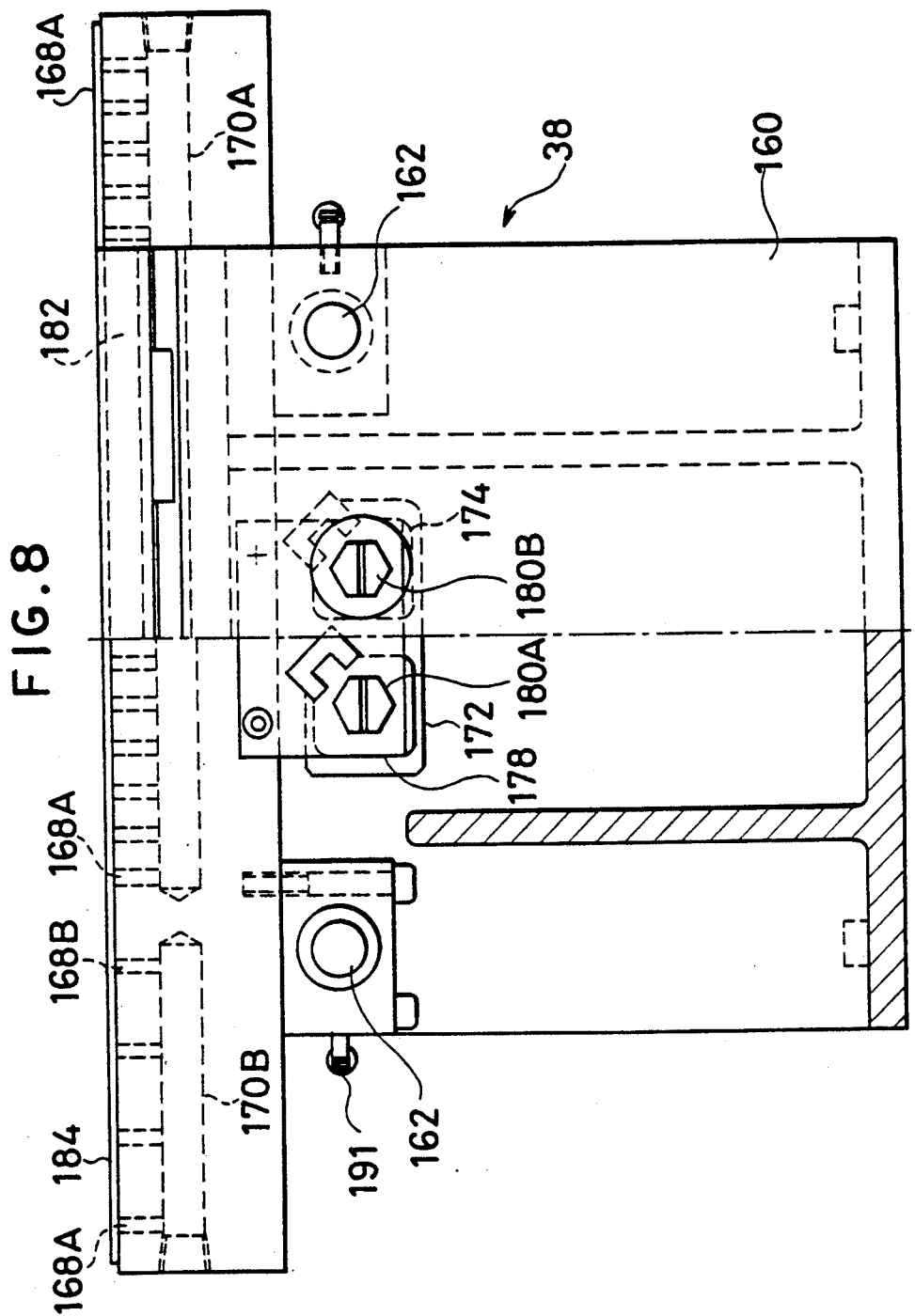
FIG. 8 is a front elevation view partly in section of the transition station shown in FIG. 7.
Figure 9:
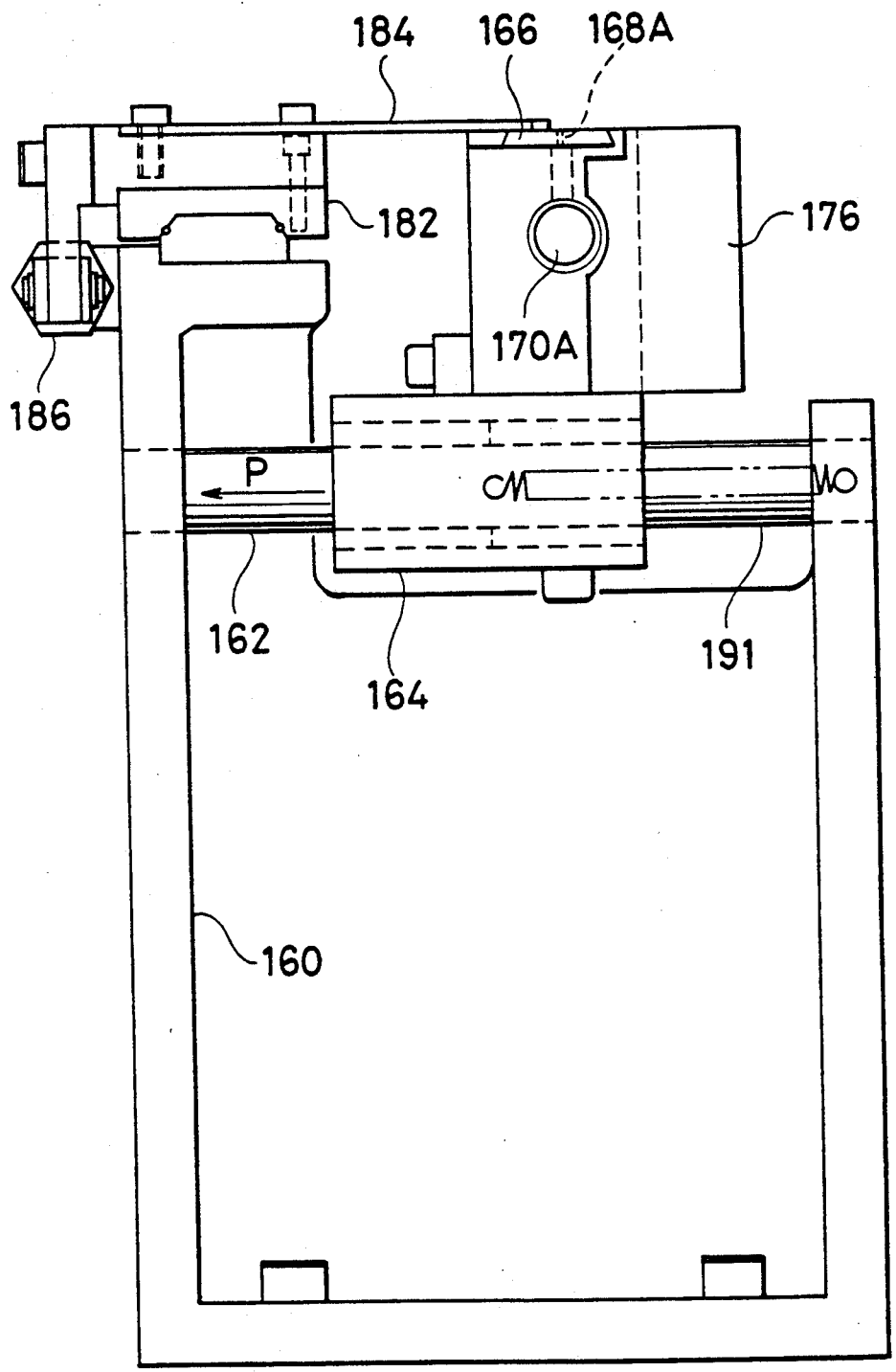
FIG. 9 is a side elevation view of the transition station shown in FIG. 7.

Each of the transition stations 38 may be constructed in such a manner as shown in FIGS. 7 to 9. The transition station 38 includes a station frame 160 fixed on the base 52, on which a Y-direction slide guide shaft 162 is fixedly mounted. On the Y-direction slide guide shaft 162 is slidably supported a Y-direction slider 164 on which a chip stand 166 for putting chips thereon is securely arranged. On the chip stand 166 are defined chip suction positions Q corresponding in number to chips to be put thereon, and the chip suction positions Q each are formed with at least one suction hole 168 (168A or 168B). In the illustrated embodiment, each position is provided with one such suction hole. Accordingly, in the illustrated embodiment, four (4) suction holes 168B on a left side in FIG. 7 are arranged at larger equal intervals in the X direction for holding chips of a large size by suction and twenty (20) suction holes 168A on the right side are arranged at smaller equal intervals in the X direction for holding chips of a normal size. The suction holes 168A and suction holes 168B are commonly communicated with suction passages 170A and 170B formed in the chip stand 166, respectively, and the suction, passages 170A and 170B each are connected through an on-off control valve to a negative pressure source (not shown) such as a vacuum pump or the like.

On the station frame 160 are mounted an air cylinder 172 for aligning chips in the Y direction and an air cylinder 174 for discharging chips of which suction is failed to a chip receptacle 176 arranged along the chip stand 166. Piston rods of the air cylinders 172 and 174 are adapted to be abutted against stopper bolts 180A and 180B fixed on a mounting plate 178 integrally mounted on a lower side of the chip stand 166. The chip stand is constantly forced by spring means in a $Y_1$ direction in FIG. 7.

Also, the transition station 38 includes an X-direction slider 182 movably supported on the frame 160 so as to be slidable in the X direction, on which a position controlling plate 184 is fixed for positionally correcting chips put on the chip stand or aligning the chips with the suction holes 168. Between the X-direction slider 182 and the station frame 160 is arranged an air cylinder 186 for aligning or correcting chips in the X direction. The position controlling plate 184 is provided on a flat end surface thereof with a number of teeth 188 projected from the end so as to form a number of X-direction aligning or correcting surface means 190 and a number of Y-direction aligning or correcting surface means 192 each defined between adjacent X-direction aligning surface means 190. The projecting teeth 188 are arranged corresponding to the suction holes 168A.

Between the Y-direction slider 164 and the station frame 160 are arranged extension springs 191 so as to pull the Y-direction slider 164 in a direction of causing the end of the position controlling plate 184 to be separated from the suction holes 168 of the chip stand 166. The above-described construction of the transition station 38 is of course applied to both stations 38A and 38B, except arrangement of the suction holes. More particularly, in the station 38B, four suction holes 168B for chips of a large size may be eliminated, accordingly, the station 38B includes only twenty suction holes 168A for chips of a normal size.

Now, the manner of operation of the transition station constructed as described above will be described hereinafter with reference to FIGS. 10A and 10B as well as FIGS. 1 to 9.

First, a plurality of chips 40 are transferred from the chip feed section 34 to the chip suction positions Q on the chip stand 166 and then placed thereon by means of the chip extracting head section 42, during which the suction holes 168A and 168B are subjected to vacuum suction, resulting in the chips 40 being held on the chip stand 166 by suction. Then, the Y-direction correcting air cylinder 172 is actuated to cause an interval between each suction hole 168B and each of the Y-direction aligning surfaces 192 of the position correcting plate 184 to be set at a predetermined value as shown in FIG. 10A, and thereafter the X-direction aligning air cylinder 186 is actuated to cause an interval between each suction hole 168A and each of the X-direction aligning surfaces 190 of the position aligning plate 184 to be set at a predetermined value as shown in FIG. 10B. Thus, each of the chips is positionally corrected, resulting in a center of each of the chips 40 held on the chip stand 166 through the evacuated suction holes 168A being aligned with a center of the corresponding suction hole.

When the chips 40 are thus aligned with the suction holes 168B, the Y-direction and X-direction aligning air cylinders 172 and 186 are returned to their original positions to keep the position aligning plate 184 at a position separate from the chips 40. Then, the chips are picked up and transferred to the substrate by the chip depositing head section as described below.

Any remaining chip(s) on the chip stand 166 due to a failure of suction of the chip by the depositing head section during the chip suction operation hinders transferring of the next chips from the feed section to the chip stand by the chip extracting head section. In the illustrated embodiment, in order to avoid such a problem, the air cylinder for chip discharge is actuated prior to the transferring of the next chips to the chip stand 166, to thereby substantially move the Y-direction slider 164 as indicated at an arrow 194 in FIG. 9, resulting in any remaining chip being discharged to the chip receptacle 176 by the position correcting plate 184.

As described above, in the illustrated embodiment, each chip suction position Q on the chip stand is provided with one suction hole. However, it may be provided with two or more such suction holes.

Figure 11:
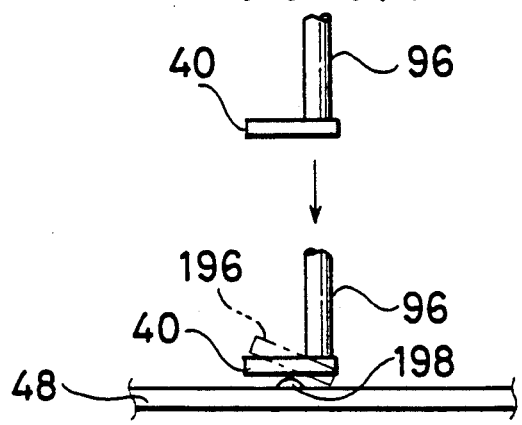
FIG. 11 is a schematic view showing misregistration between a suction pin and an electronic component held thereon.

If positional correcting and/or aligning of chips does not take place in the transition station, as shown in FIG. 11, misregistration between a center of each suction pin of the chip mounting head section 50 and a center of a chip 40 and such an incorrect posture of the chip as indicated at phantom lines due to intervention of an adhesive 198 between the chip 40 and a substrate 48 occur even when a position of the chip with respect to the substrate is corrected by subjecting a posture of the chip held on the suction pin to image processing. The illustrated embodiment allows a center of the chip to be substantially aligned with a center of the suction pin of the depositing head section, to thereby effectively eliminate the above-described disadvantage.

Figure 12:
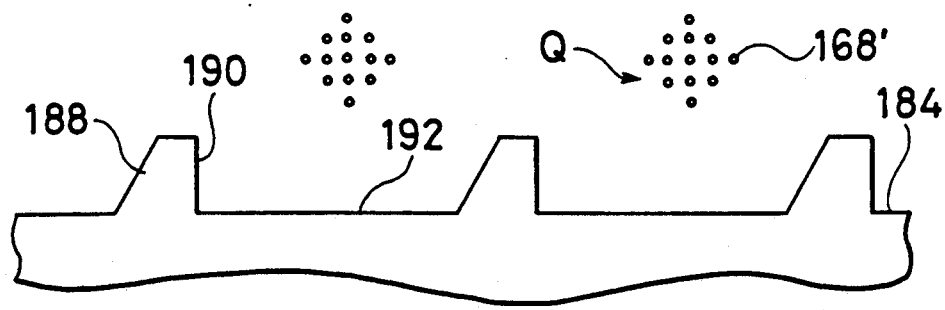
FIG. 12 is a fragmentary enlarged schematic plan view showing an essential part of a modification of the transition station shown in FIG. 7.

FIG. 12 shows a modification of the transition station described above, wherein each of chip suction positions Q is provided with a plurality or number of smaller suction holes 168'. Such construction causes each chip suction position Q to be constituted by a group of the small suction holes 168', resulting in various kinds of chips substantially different in size or configuration being positively held by suction.

As can be seen from the foregoing, in the transition station, the single position aligning or correcting plate is arranged in a manner to be common to a number of chips, resulting in positional correcting and aligning of the chips being simultaneously and rapidly carried out in a simple manner. Also, the transition station may be significantly small-sized because it is not required to arrange a chip positioning mechanism for every chip and it is possible to minimize an interval between each adjacent chip suction position.

Figure 13:
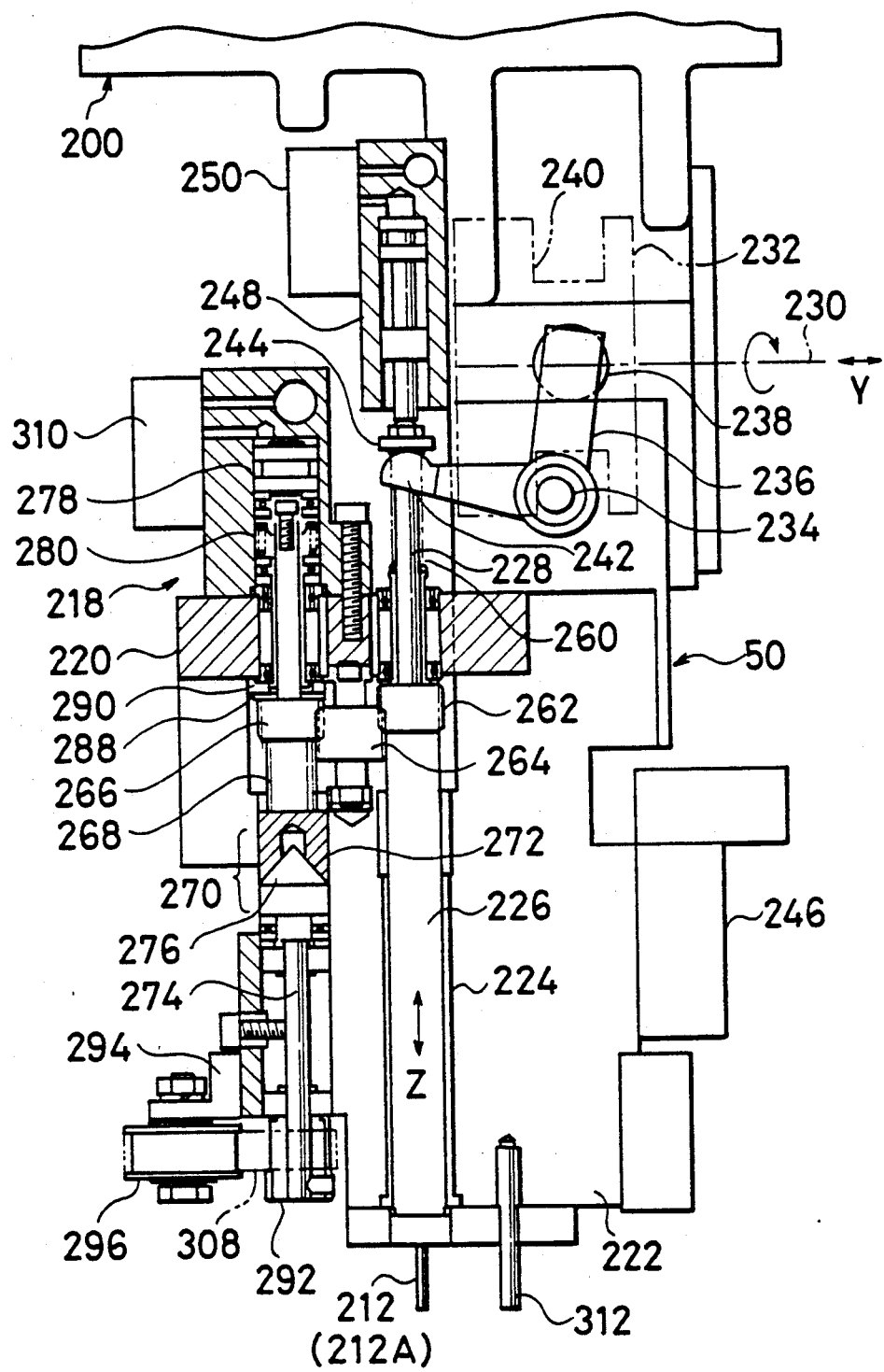
FIG. 13 is a side elevation view in section showing an electronic component depositing head section.

FIG. 13 shows the chip depositing head section 50 (50A or 50B) which serves to pick up chips from the transition station 38 by suction and deposit them on the substrate through transferring of them to substrate. The chip depositing head sections 50A and 50B may be constructed in substantially the same manner except for the arrangement of the suction pins.

The chip depositing head section 50 is supported on a lower side of an X-Y table 200. More particularly, as shown in FIG. 3, a Y-direction slider 202 is supported on a Y-direction slider guide arranged on a frame of the section 50 so as to be slidable in the Y direction and a female screw member integral with the Y-direction slider 202 is engaged with a Y-direction ball screw shaft 204 supported on the frame, so that rotation of the ball screw shaft 204 causes the Y-direction slider 202 to be moved in the Y direction. On a lower side of the Y-direction slider 202 is mounted an X-direction slide guide 206 on which an X-direction slider 208 is supported so as to be slidable in the X direction, and a female screw member integral with the X-direction slider 208 is engaged with an X-direction ball screw shaft 210 supported on the Y-direction slider 202, so that rotation of the ball screw shaft 210 causes the X-direction slider 208 to be moved in the X direction. The depositing head section 50 is mounted on a lower side of the X-direction slider 208.

Figure 14:
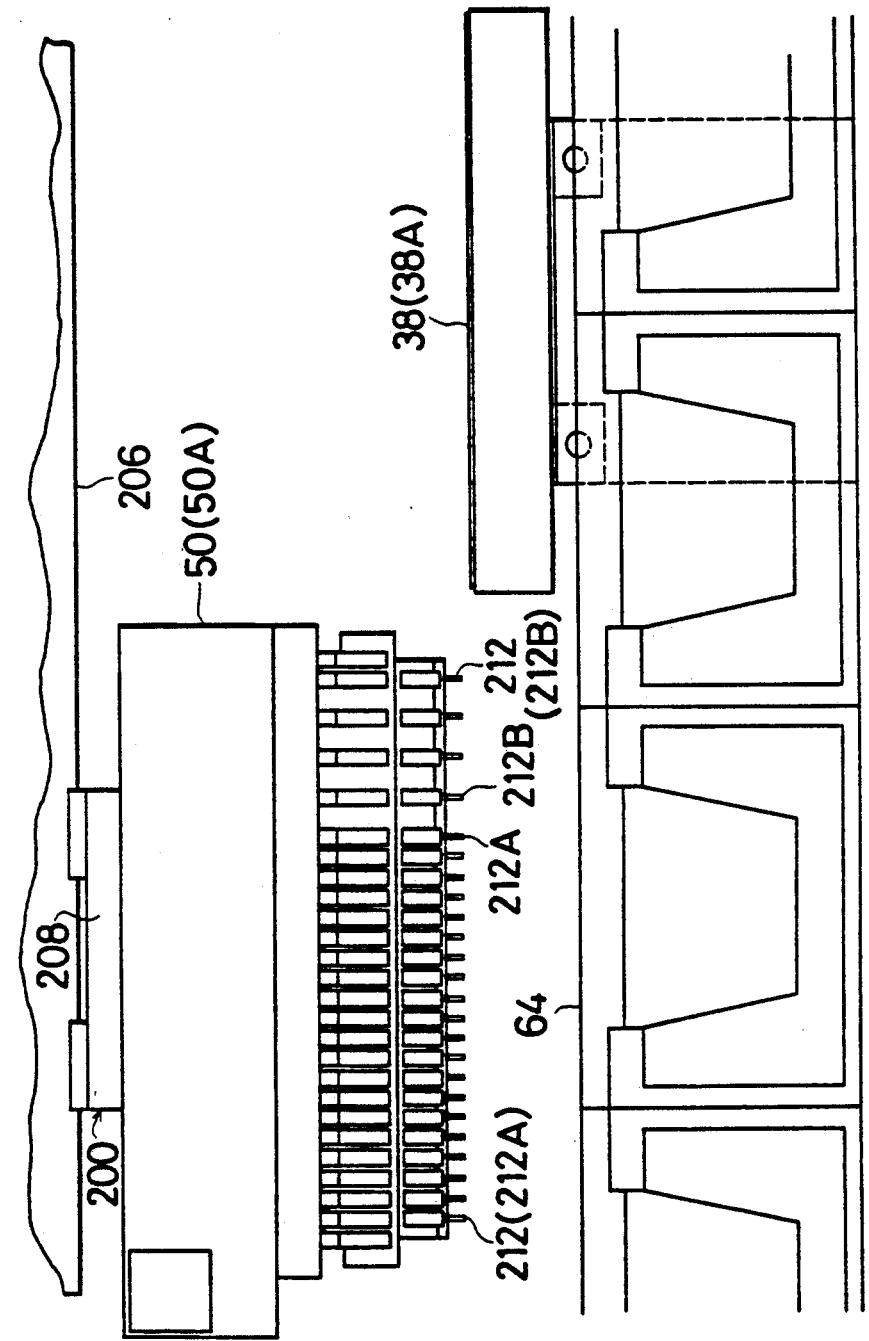
FIG. 14 is a rear view showing one of the electronic component depositing head sections and its periphery.

In the illustrated embodiment, the chip depositing head section 50A, as shown in FIG. 14, includes suction pins 212 arranged in a manner corresponding to the arrangement of the suction pins 96 of the chip extracting head section 42 and therefore the arrangement of suction holes 168A of the transition station 38A. Accordingly, the section 50A includes twenty suction pins 212A for chips of a normal size and four suction pins 212B for chips of a large size.

Figure 15:
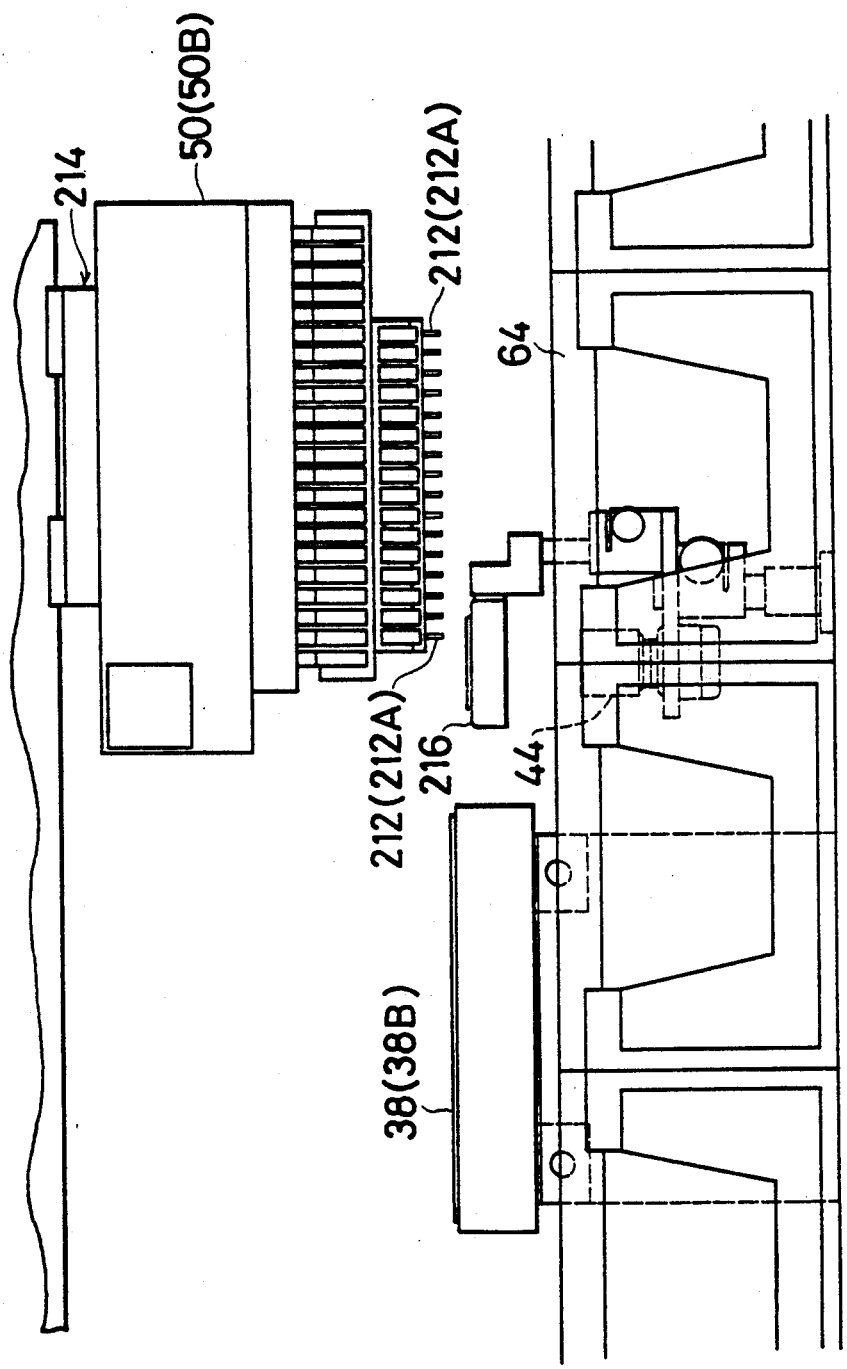
FIG. 15 is a rear view showing the other of electronic component depositing head sections and its periphery.

FIG. 15 shows the other chip depositing head section 50B for handling chips on the transition station 38B. The head section 50B is mounted on a lower side of an X-Y table 214 and includes arrangement of suction pins corresponding to the arrangement of the suction holes of the transition station 38B, resulting in including only twenty suction pins 212A for chips of a normal size. In FIG. 15, reference numeral 216 designates illumination means in association with the camera 44.

The chip depositing head section 50 (50A or 50B), as shown in FIG. 13, includes suction pin actuation mechanisms 218 arranged to correspond to the suction pins 212 for vertically moving and rotating the suction pins 212, respectively. More particularly, the mechanisms 218 each include a frame 220 and a block 222 fixed on the frame 220. The block 222 is provided with a cylindrical hole 224 in which an actuation element or member 226 having the suction pin 212 mounted at a lower end thereof is inserted in a manner to be slidable in a vertical direction or Z direction and rotatable about its axis. The actuation member serves at an upper portion thereof as an actuation rod 228. Also, on the frame 220 is supported a revolving shaft 230 so as to extend in the Y direction, on which a cylindrical grooved cam 232 is fixed. In the frame 220 is supported a shaft 234 extending in the X direction, on which a single cam follower 236 is mounted. On one end of the cam follower 236 is pivotally mounted a roller 238 which is then engaged with a cam groove 240 of the grooved cam 232. This results in rotation of the grooved cam 232 causing the cam follower 236 to carry out pivotal movement. The single cam follower 236 is common to all suction pins 212 and provided at the other end thereof with connections 242 in a manner to be separate from one another and correspond to the respective suction pins. The connections 242 each are arranged so as to engage with an association plate 244 mounted on an upper end of the actuation rod 228.

Each of the suction pins 212 is formed with a suction hole, which is communicated through vacuum suction passages of the actuation member and block 222 and through a valve 246 to a negative pressure source such as a vacuum pump or the like. Above each of the actuation rods 228 is arranged a selective air cylinder 248, which is fixed on the frame 220. Supply of compressed air to each of the selective air cylinders 248 is controlled by an on-off valve 250. The actuation member 226 having the suction pin 212 mounted at its lower end is constantly upwardly urged by a compression spring 260 arranged around the actuation rod 228.

On the actuation element or member 226 is fixedly mounted a gear 262, which is engaged with a gear 264 rotatably supported on the frame 220. The gear 264 is meshed with a gear 266 integral with a follower shaft 268 of a clutch 270. The follower shaft 268 is provided at a lower end thereof with a substantially conical recess 272 for frictional connection and supported on the frame 220 in a manner to be rotatable and somewhat movable in an axial direction thereof. The clutch 270 also includes a main shaft 274 provided at an upper end thereof with a conical projection 276 corresponding to the recess 272. Thus, when an air cylinder 278 for clutch connection is actuated to downwardly move the follower shaft 268, the shaft 268 is operatively connected through the recess 272 and projection 276 to the main shaft 274 to transmit a revolving force of the shaft 268 to the shaft 274. When the air cylinder 278 is not actuated, a compression spring 280 functioning to upwardly urge the follower shaft 44 causes the recess 272 to be separated from the projection 276 to carry out separation between the shafts 268 and 274, as well as causes the gear 266 to be pressedly abutted through a brake plate 288 against a stationary plate 290 of the frame 220 to prevent racing of the follower shaft 268.

The main shaft 274 of the clutch 270 is rotatably supported on the frame 220 and is fixedly provided at a lower end thereof with a pulley 292 for revolving the suction pin 212. Correspondingly, on the frame 220 is fixed a fitment 294 on which a guide pulley 296 is pivotally mounted.

Figure 16:
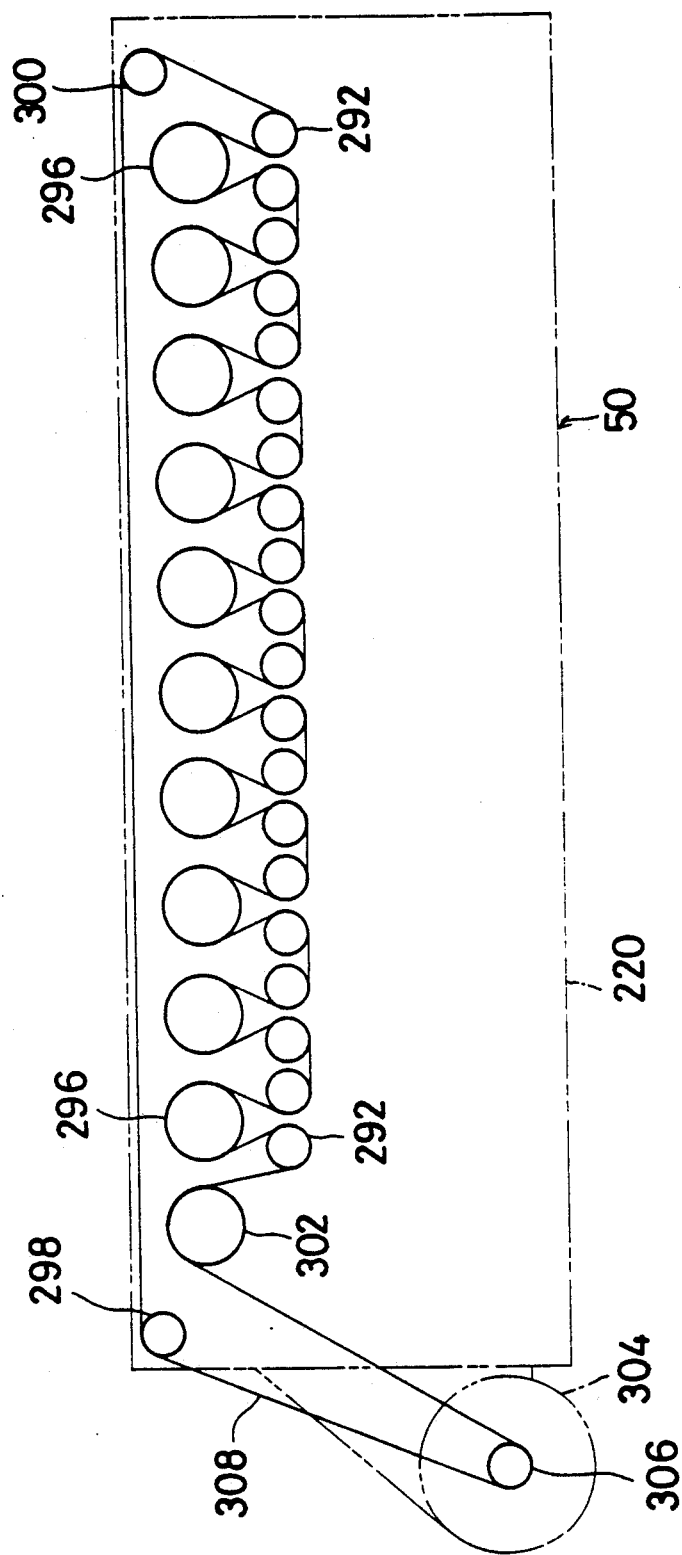
FIG. 16 is a plan view showing a wrapping connection mechanism for an electronic component depositing head section.

FIG. 16 shows an arrangement for transmitting a driving force from a single drive source to each of the suction pins 212, which includes the suction pin revolving pulley 292 arranged corresponding to each of the suction pins 212, the guide pulley 296 corresponding to each suction pin, each one guide pulley 298, 300 and 302 arranged on both sides of the frame 220, a common motor 304 equipped with a reduction unit, and a drive pulley 306 fixed on a drive shaft of the motor 304, as well as the manner of stretching of a timing belt 308 among the pulleys. As can be seen from FIG. 16, the pulleys for revolving the suction pins 212 are rotated by the same angle in the same direction. Reference numeral 310 designates a valve for carrying out on-off control of the supply of compressed air to the air cylinder 278.

Figure 17A:
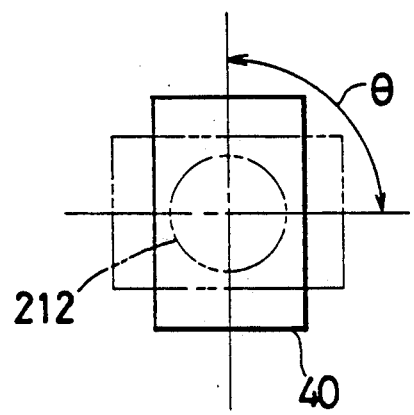
FIGS. 17A and 17B each are a schematic view showing an operation of rotation of an electronic component.
Figure 17B:
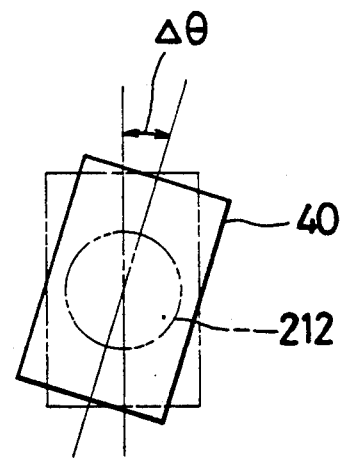

In the chip depositing head section 50 constructed as described above, in connection with each of the suction pins 212 of which the corresponding valves 250 are turned on, compressed air actuates the selective air cylinder 248 to cause the rod member 226 and therefore the suction pin 212 to be downwardly movable against the compression spring 260, so that the suction pin 212 may be vertically movable following pivotal movement of the cam follower 236, resulting in being ready for its suction operation. Suction of a chip by each of the suction pins 212 is started at a time when the X-Y table 214 moves each of the suction pins 212 of the depositing head section 50 to a position above the corresponding chip suction position on the transition station 38. Then, the suction pins 212 hold chips put on the transition station 38 by suction. When rotation of any chip by the suction pin is required, the corresponding valve 310 is operated to actuate the air cylinder 278, resulting in carrying out clutch connection. The chip held on suction pin 212 is rotated through the gears to a position of a predetermined rotation angle corresponding to a time for which the clutch connection is kept or continues. In this instance, rotation of a chip by the suction pin 212 is carried out by a main rotating operation for rotating a chip 40 by a large angle θ such as, for example, 45 degrees, 90 degrees, 180 degrees, 270 degrees or the like as shown in FIG. 17A. Alternatively, it may be a correcting operation for rotating a chip 40 by a micro-angle or small angle Δθ to correct a posture of the chip as shown in FIG. 17B.

The selective air cylinder does not act on the suction pin 212 of which the corresponding valve 250 is turned off, so that the suction pin is kept at its raised position without carrying out the suction operation.

The chip depositing head section 50 of which the suction pins hold the chips thereon by suction and are rotated so as to rotate the chips by a predetermined rotation angle as desired is then moved to a position above a substrate held at a predetermined position. Then, the suction pins are selectively actuated in succession to deposit the chips on predetermined positions of the substrate to which an adhesive is applied, resulting in the chips being mounted on the substrate.

As described above, actuation of the suction pins 212 of the chip depositing head section 50 is carried out by means of the cam mechanism, resulting in a speed of the actuation being increased as compared with direct actuation of suction pins by air cylinder means.

Figure 18:
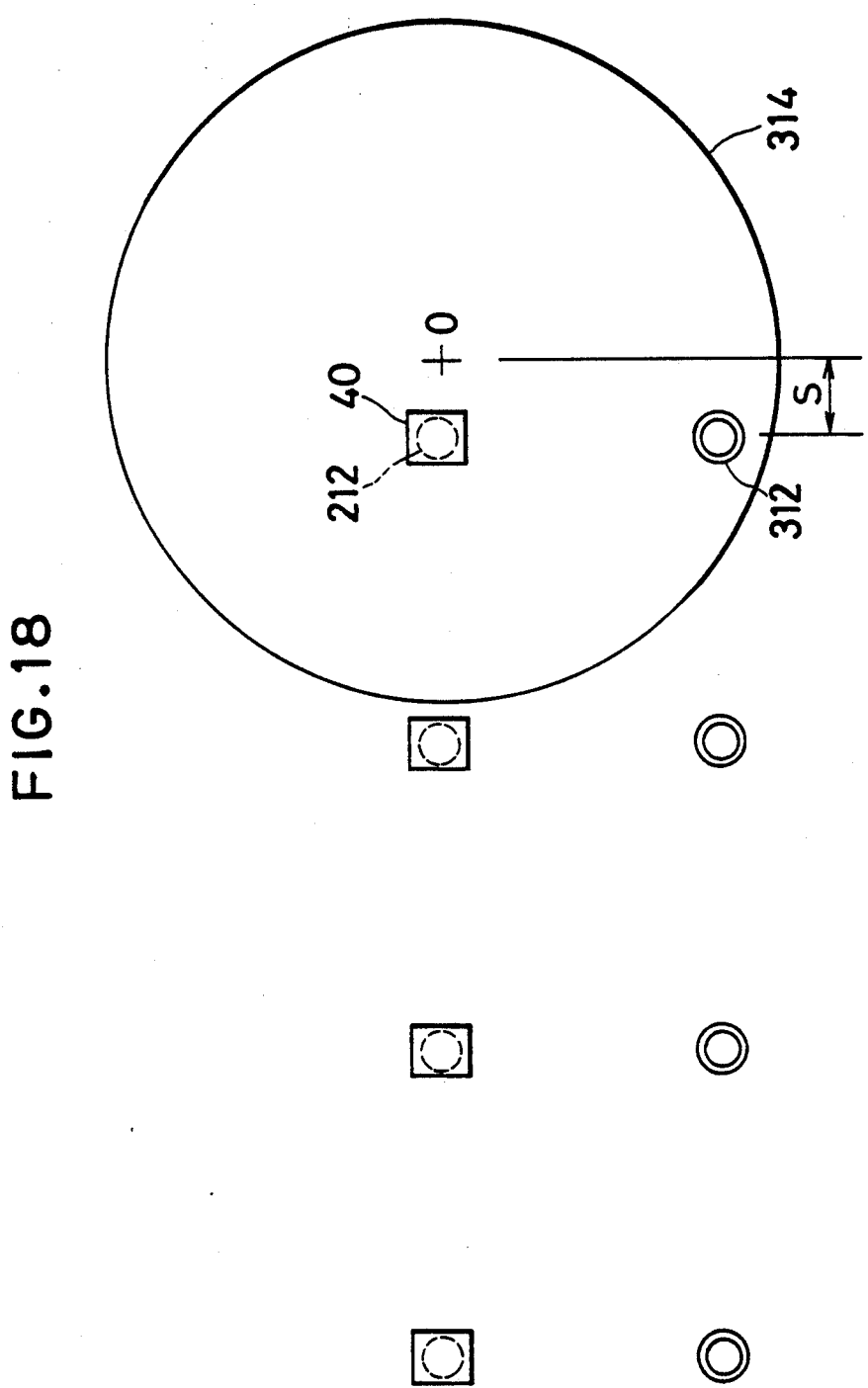
FIG. 18 is a bottom view showing an arrangement of an electronic component and a suction pin viewed through a camera.

For the sake of convenience for image processing, as shown in FIGS. 13 and 18, a mark pin 312 is provided in proximity to each of the suction pins 212 in a manner such that a position of each mark pin 312 in the X direction is aligned with that of the suction pin in the X direction.

Also, in the depositing head section 50, the clutch 270 is arranged for every suction pin 212. Also, times for which connections between the clutch follower shafts 268 and the clutch main shafts 274 in pairs are carried out are set to suitable lengths independently from each other while the single rotation drive source rotates a plurality of the main clutch shafts 274. Such construction permits the respective suction pins to be respectively set to predetermined rotation angles independently from one another, as well as permits the depositing head section to be small-sized and compact.

As described above, in the depositing head section, the single drive source is commonly used for actuation of all suction pins and time for which clutch connection is carried out is determined independently for every suction pin, so that setting of the rotation angle may be rapidly carried out with respect to a plurality of the suction pins. Also, the structure may be simplified irrespective of an increased number of the suction pins, resulting in the head section being compact.

FIG. 18 is a bottom view of the chip 40 held on the suction pin 212 observed through the camera 44. A visual field of the camera 44 is indicated at a circle 314 in FIG. 18. A shutter of each of the cameras 44 is so operated that the suction pin 212 and mark pin 312 in pair is in the visual field of the camera when the depositing head section 50 passes over the camera 44 at an equal velocity. It is not required to stop the depositing head section 50 above the camera 44, accordingly, the time required for moving the head section 50 from the transition station 38 to the substrate 48 is reduced.

Figure 19:
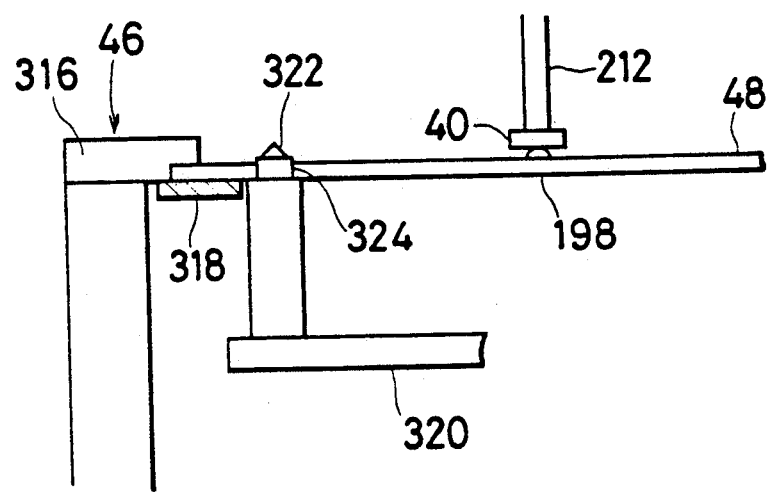
FIG. 19 is a fragmentary side elevation view in section showing a printed board supported and positioned by a belt conveyer mechanism.

Now, the conveyer belt mechanism 46 will described with reference to FIGS. 1, 3 and 19.

The mechanism 46 includes a pair of guide rails 316 for slidably guiding the substrates in the X direction and a belt 318 for carrying the substrates to predetermined stop positions or chip depositing positions in succession. In the embodiment, two such stop positions are set. The substrates are carried in the $X_1$ direction in FIG. 2. Also, the mechanism 46 includes a pair of vertically movable plates 320 each provided thereon with a positioning pin 322 so as to upwardly extend therefrom. The positioning pins 322 each are adapted to be inserted into a positioning hole 324 of the substrate 48 when the substrate is transferred to one of the two chip depositing positions, to thereby hold the substrate at the position.

Now, the manner of chip mounting operation of the chip mounting apparatus of the illustrated embodiment described above will be described hereinafter with reference to the accompanying drawings.

The suction pins 96A and 96B of the chip extracting head section 42 are lowered at the chip feed position P of the desired feed unit 36 of the feed section 34 to extract desired chips of normal and large sizes by suction and raised. Such operation of the suction pins 96A and 96B is carried out in sequence or simultaneously. When all suction pins 96 thus hold the desired chips 40 thereon by suction, the extracting head section is moved to the chip stand 166 of one transition station 38 or the transition station 38A shown in FIG. 7, concurrent lowering of the suction pins 96 is carried out for putting the chips 40 on the chip stand 166. Then, the extracting head 42 is returned to the position above the feed section 34. Subsequently, the suction pins extracts the chips 40 of a normal size from the desired feed unit and then carry them to the transition station 38B.

Figure 10A:
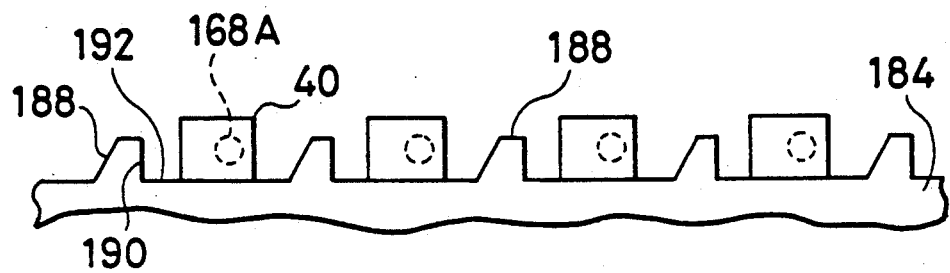
FIGS. 10A and 10B each are a schematic view showing a manner of positional correction of an electronic component in the transition station shown in FIG. 7.
Figure 10B:
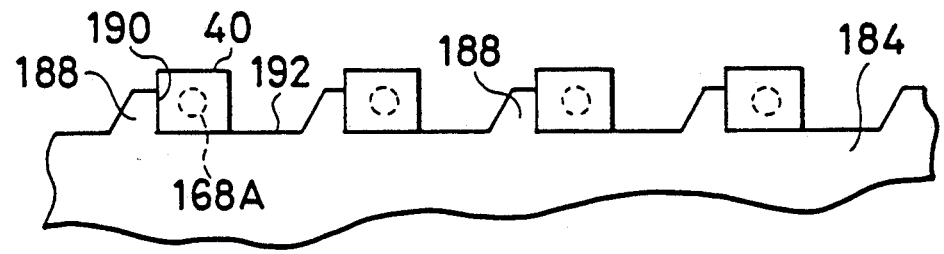

On each of the transition stations 38A and 38B, the position controlling plate 184 carries out positional correction of the chips with respect to the suction holes 168 of the chip suction positions Q according to the procedures shown in FIGS. 10A and 10B.

Subsequently, the suction pins 212A and 212B of the chip depositing head section 50A are lowered to pick up the positionally corrected chips 40 from the transition station 38A and then upwardly moved. The suction pins 212A and 212B travel over the camera 44 arranged adjacent to the transition station 38A at a constant velocity in the X direction and then reach the position above the printed board 48A previously located at the chip depositing position.

Figure 20A:
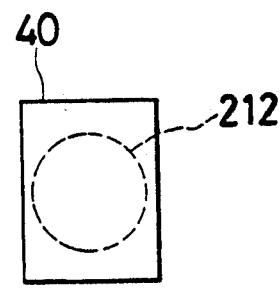
FIG. 20A is a schematic view showing a correct posture of an electronic component with respect to a suction pin.

The camera 44 produces a still picture as shown in the circle 314 in FIG. 18, resulting in a deviation S in the X direction between the mark pin 312 and a center O of a visual field of the camera 44 being calculated, as well as a position of the suction pin 212 corresponding to the mark pin 312 to be measured. Thus, a posture of the chip 40 with respect to the suction pin 212 is judged by image processing. FIG. 20A shows a correct posture of the chip 40.

Figure 20B:
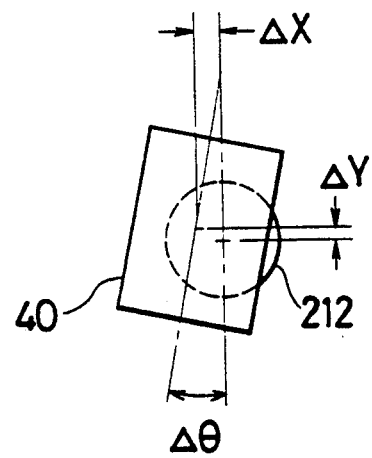
FIG. 20B is a schematic view showing an electronic component held on a suction pin in an incorrect posture.

FIG. 20B shows an example of a failure in positioning of the chip 40 with respect to the suction pin 212, wherein $\Delta X$ designates a deviation in the X direction, $\Delta Y$ is a deviation in the Y direction, and $\Delta \theta$ is a deviation in the rotating direction. $\Delta X$ and $\Delta Y$ are corrected by the X-Y table 214 and $\Delta \theta$ is corrected by rotation of the suction pin 212. Further, when a change in a direction of the chip 40 such as, for example, rotation of the chip 40 by an angle of 90 degrees is required, this is likewise carried out by rotation of the suction pin.

Thus, the suction pins 212A and 212B of the depositing head section 50A are lowered to the chip depositing positions on the printed circuit board 48A to which an adhesive 198 is applied while a position of each of the X-Y table 214 and suction pin is varied as required depending on results of processing of a still picture obtained through the camera 44, resulting in accomplishing mounting of the chips on the substrate.

Likewise, the suction pins 212A of the chip depositing head section 50B are lowered to pick up the positionally corrected chips 40 from the transition station 38B and then upwardly moved. The suction pins 212A travel over the camera 44 arranged adjacent to the transition station 38B at a constant velocity in the X direction and then reach the position above the printed board 48B previously located at the chip mounting position. Then, deviations $\Delta X$, $\Delta Y$ and $\Delta \theta$ of each of the chips with respect to the corresponding suction pin 212A are detected based on a still picture obtained through the camera 44. If required, correction of $\Delta X$ and $\Delta Y$ is carried out by means of the X-Y table 214 and $\Delta \theta$ is corrected through rotation of the suction pin. Also, a change in a direction of the chip 40, if required, is carried out by rotation of the suction pin. Thereafter, the suction pins 212A of the depositing head section 50B are likewise lowered to the chip depositing positions on the printed circuit board 48B, thus, mounting of the chips on the substrate is carried out.

As can be seen from the foregoing, the chip mounting apparatus of the present invention is so constructed that the transition stations are interposedly arranged between the chip feed section and the substrate carrying mechanism to cause the chips to be handled according to a reciprocating relay system. Such construction permits the next chips to be extracted from the feed section by the extracting head section before the previously extracted chips are deposited on the substrate by the depositing head section, to thereby substantially reduce the time required between extraction of the chips from the chip feed section and deposition of the chips on the substrate, resulting in carrying out the chip mounting operation at a high speed, as compared with the prior art wherein the mounting head is reciprocated directly between the chip feed section and the substrate.

Also, in the present invention, the chip extracting head section and chip depositing head sections each include a plurality of the suction pins, so that various kinds of chips may be effectively handled.

In the apparatus of the present invention, one chip extracting head which can rapidly carry out its operation in a short period of time covers two or more transition stations, and the chip depositing head sections which carry out deposition of the chips on the substrate requiring much time because a total distance by which each head section travels on the substrate is highly increased are arranged corresponding in number to the transition stations, so that the chip depositing operation by the depositing head sections may be independently carried out with respect to each of the substrates arranged corresponding in number to the transition stations, resulting in the chip mounting operation being more efficiently carried out. Thus, it will be noted that the arrangement of both chip extracting head section and chip depositing head sections in the present invention contributes to an excellent time balance between extraction of the chips from the feed section and deposition of the chips on the substrate in the chip mounting operation.

Further, in the present invention, a posture of the chip with respect to the suction pin while being held thereon is corrected by image processing through the camera, leading to mounting with high accuracy.

Moreover, in the present invention, the chip feed section is stationary, so that a floor area required for installing the apparatus may be significantly reduced and the number of feed units arranged in the same floor area may be increased, as compared with the conventional traveling feed section.

While a preferred embodiment of the invention has been described with a certain degree of particularity with reference to the drawings, obvious modifications and variations are possible in the light of the above teachings. It is therefore to be understood that within the scope of the appended claims, the invention may be practiced otherwise as than as specifically described.

What is claimed is:

1. An electronic component mounting apparatus comprising:
    a stationary feed section for feeding electronic components including a plurality of electronic component feed units;
    a plurality of transition stations;
    a single electronic component extracting head section including a plurality of suction pins for extracting electronic components by suction from said stationary feed section and placing them on said transition stations; and
    a plurality of electronic component depositing head sections arranged corresponding in number to said transition stations and each including a plurality of suction pins;
    said depositing head sections picking up electronic components by suction from said transition stations to deposit them on substrates positioned corresponding in number to said transition stations.

2. An electronic component mounting apparatus as defined in claim 1 further comprising a camera for providing an image of the electronic component suckedly held on each of said suction pins of each of said depositing head sections,
    said depositing head sections suckedly picking up said components from said transition stations, traveling over said cameras and depositing said electronic components on said substrates.

3. An electronic component mounting apparatus as defined in claim 1 or 2, wherein said transition stations are provided with electronic component suction positions corresponding in number to said suction pins of said depositing head sections.

4. An electronic component mounting apparatus as defined in claim 2, wherein said image of said electronic component obtained through said camera is utilized to detect misregistration between said electronic component and said suction pin, so that a position of said suction pin when said electronic component is deposited on said substrate can be corrected.

5. An electronic component mounting apparatus as defined in claim 2, wherein some of said suction pins of each of said extracting head section and depositing head sections are arranged at an increased interval.

6. An electronic component mounting apparatus as defined in claim 2, wherein said transition stations each comprises:
    an electronic component stand provided thereon with a plurality of electronic component suction positions arranged in an X direction, said suction positions each being formed with at least one suction hole; and
    a position controlling plate formed with a plurality of X-direction positioning surface means and a plurality of Y-direction positioning surface means perpendicular to said X-direction positioning surface means for carrying out correction of electronic components put on said stand;
    said stand and position controlling plate being movable relative to each other in the X and Y directions.

7. An electronic component mounting apparatus as defined in claim 2, wherein said depositing head sections each comprises;
    a head frame;
    a plurality of actuation elements supported on said head frame in a manner to be vertically movable and rotatable and each having a suction pin mounted on a lower end thereof;
    a plurality of clutches arranged corresponding to said actuation elements and each including a follower shaft and a main shaft supported on said head frame so as to be selectively engaged with each other;
    said follower shafts and actuation shafts corresponding to each other being operatively connected to one another through transmission mechanisms, respectively;
    a common drive shaft operatively connected to said main shafts through a wrapping connection mechanism so that said main shafts may be rotated by the same angle in the same direction, resulting in a rotation angle of each of said actuation elements being defined by time for which connection of said clutch is carried out.

8. An electronic component mounting apparatus as defined in claim 7, wherein said actuation element is actuated by a cam mechanism.

* * * * *